United States Patent [19]

Sako et al.

[11] Patent Number: 5,031,181

[45] Date of Patent: Jul. 9, 1991

[54] ERROR CORRECTION PROCESSING APPARATUS

[75] Inventors: Yoichiro Sako, Chiba; Shigeru Imura, Tokyo; Takeshi Fukami, Kanagawa, all of Japan

[73] Assignee: Sony Corporation, Tokyo, Japan

[21] Appl. No.: 386,787

[22] Filed: Jul. 27, 1989

[30] Foreign Application Priority Data

Jul. 30, 1988 [JP] Japan .................. 63-191688

[51] Int. Cl.⁵ .............................. G06F 11/10
[52] U.S. Cl. ..................... 371/41; 371/37.8
[58] Field of Search .............. 371/41, 38.1, 39.1, 371/37.1, 37.8

[56] References Cited

U.S. PATENT DOCUMENTS

| | | | |
|---|---|---|---|
| 3,078,443 | 2/1963 | Rose | 371/41 |
| 3,496,549 | 2/1970 | Tong | 371/41 |
| 3,506,961 | 4/1970 | Abramson | 371/41 |
| 3,896,416 | 7/1975 | Barrett | 371/41 X |
| 4,397,022 | 8/1983 | Weng | 371/41 X |
| 4,654,853 | 3/1987 | Moriyama | 371/37.1 X |
| 4,701,923 | 10/1987 | Fukasawa | 371/41 |
| 4,890,286 | 12/1989 | Hirose | 371/37.1 |
| 4,914,660 | 4/1990 | Hirose | 371/37.1 |
| 4,958,349 | 9/1990 | Tanner | 371/37.1 |

FOREIGN PATENT DOCUMENTS

| | | |
|---|---|---|
| 0167627 | 1/1986 | European Pat. Off. . |
| 0223255 | 5/1987 | European Pat. Off. . |
| 0120528 | 5/1988 | Japan ................. 371/41 |
| 2140593 | 11/1984 | United Kingdom . |
| 2187008 | 8/1987 | United Kingdom . |

OTHER PUBLICATIONS

M. Hsiao, "DEC with Separable SEC Capability", IBM TDB, vol. 14, No. 8, 1/1972, pp. 2363-2365.

Primary Examiner—Robert W. Beausoliel
Attorney, Agent, or Firm—Philip M. Shaw, Jr.

[57] ABSTRACT

An error correcting apparatus including a circuit for detecting error correcting modes of incoming digital information, a generator for generating a first set of syndromes for a first error correcting mode when the incoming digital information is detected as the first error correcting mode, a generator for generating a second set of syndromes for a second error correcting mode when the incoming digital information is detected as the second error correcting mode, a generator for generating quasi-syndromes for the second error correcting mode by adding an additional syndrome to the syndromes for the first error correcting mode when the incoming digital information is detected as the first error correcting mode, and an error correction circuit for applying an error correcting process to the incoming digital information based on the generated syndromes for the second error correcting mode in spite of the error correcting modes of the incoming digital information.

5 Claims, 2 Drawing Sheets

ERROR CORRECTION PROCESSING APPARATUS

BACKGROUND OF THE INVENTION

1. Field of the Invention

The present invention relates generally to an error correcting apparatus and more particularly to an error correcting apparatus suitable for signal transmission.

2. Description of the Prior Art

A digital signal transmission system is generally provided with an error correcting mode which carries out a standard error correction. Recently, there are known various record mediums, from which there are derived signals of various qualities. Considering that the signal transmission system may be used under severe conditions, it is proposed that the signal transmission system should also be provided with another error correcting mode which carries out an error correction which is more powerful than that of the first error correcting mode.

Error correcting codes (ECC) of the first error correcting mode are represented by, for example, (n, i, d) single error correction (SEC)—double error detection (DED) extended BCH codes, whereas error correcting codes (ECC) of the second error correcting mode are represented by, for example, (n', i', d') double error detection (DED)—triple error detection (TED) extended BCH codes where n and n' are the code lengths, i and i' the data lengths and d and d' the minimum distances, respectively. If the error correcting codes are defined by, for example, Galois field ($2^4$), then they become (15, 10, 4) extended BCH codes for the first error correcting mode and they also become (15, 6, 6) extended BCH codes for the second error correcting mode.

The extended BCH code is reduced by one data bit from the normal BCH code, in the first error correcting mode (15, 11, 3) and in the second error correcting mode (15, 7, 5), so that the error correction ability is reinforced to provide the extensibility.

A generator polynomial $G_1(x)$ of the first error correcting mode in case of Galois field ($2^4$) is expressed by the following equation $$G_1(x) = (x^4 + x + 1)(x + 1) \qquad (1)$$

Further, a generator polynomial $G_2(x)$ of the second error correcting mode in case of Galois field ($2^4$) is expressed by the following equation $$G_2(x) = (x^4 + x + 1)(x + 1)(x^4 + x^3 + x^2 + x + 1) \qquad (2)$$

Let it be assumed that $M_1(x)$ and $M_2(x)$ are transmission polynomials of the first and second error correcting modes. Also, assuming that $S_1$ is the remainder when $M_1(x)$ and $M_2(x)$ are divided by $(x^4 + x + 1)$, p is the remainder when $G_1(x)$ and $M_2(x)$ are divided by $(x + 1)$ and $S_3$ is the remainder when $M_2(x)$ is divided by $(x^4 + x^3 + x^2 + 1)$, then syndromes $S_1$ and P are generated for the first error correcting mode, whereas syndromes $S_1$, P and $S_3$ are generated for the second error correcting mode. That is, the syndrome $S_3$ is not generated in the first error correcting mode.

As described above, the syndromes $S_1$ and P are generated in the first error correcting mode and the syndromes $S_1$, P and $S_3$ are generated in the second error correcting mode. Consequently, the syndrome $S_3$ is not generated in the first error correcting mode so that the first and second error correcting modes can not be made common from both a software standpoint and a hardware standpoint. As a result, the prior-art error correcting apparatus can not be simplified in circuit arrangement.

SUMMARY OF THE INVENTION

It is an object of the present invention to provide an improved error correcting apparatus which can remove the defects encountered with the prior art.

More specifically, it is an object of the present invention to provide an error correcting apparatus in which the first and second error correcting modes can be effected by a single common arrangement.

It is another object of the present invention to provide an error correcting apparatus which can be simplified in arrangement.

It is still another object of the present invention to provide an error correcting apparatus at reduced manufacturing cost.

According to an aspect of the present invention, there is provided an error correcting apparatus comprising:

(a) means for detecting an error correcting mode of incoming digital information;

(b) means for generating a first set of syndromes for a first error correcting mode when said incoming digital information is detected as said first error correcting mode;

(c) means for generating a second set of syndromes for a second error correcting mode when said incoming digital information is detected as said second error correcting mode;

(d) wherein the means for generating the first set of syndromes includes means for adding an additional syndrome to said first set of syndromes when said incoming digital information is detected as employing said first error correcting mode; and;

(e) error correcting means for applying an error correcting process to said incoming digital information based on said generated syndromes for said second error correcting mode in spite of the error correcting mode of said incoming digital information.

According to another aspect of the present invention, there is provided an error correcting apparatus comprising:

(1) syndrome generating means supplied with incoming digital information and an identification signal representing an error correcting mode of said incoming digital information for generating a set of syndromes for said incoming digital information based on said identification signal;

(2) error condition detecting means connected to said syndrome generating means for generating an error condition indicating signal based on said set of syndromes;

(3) error correction table means connected to said error condition detecting means for generating an error position signal based on said error condition indicating signal; and (4) an error correction circuit supplied with said incoming digital information and connected to said error correction table means for correcting bit errors included in said incoming digital information based on said error position signal obtained from said error correction table means.

These and other objects, features and advantages of the present invention will be apparent from the following detailed description of a preferred embodiment when read in conjunction with the accompanying drawings.

DETAILED DESCRIPTION OF A PREFERRED EMBODIMENT

An embodiment of an error correcting apparatus according to the present invention will hereinafter be described in detail with reference to FIGS. 1 and 2.

Figure 1:
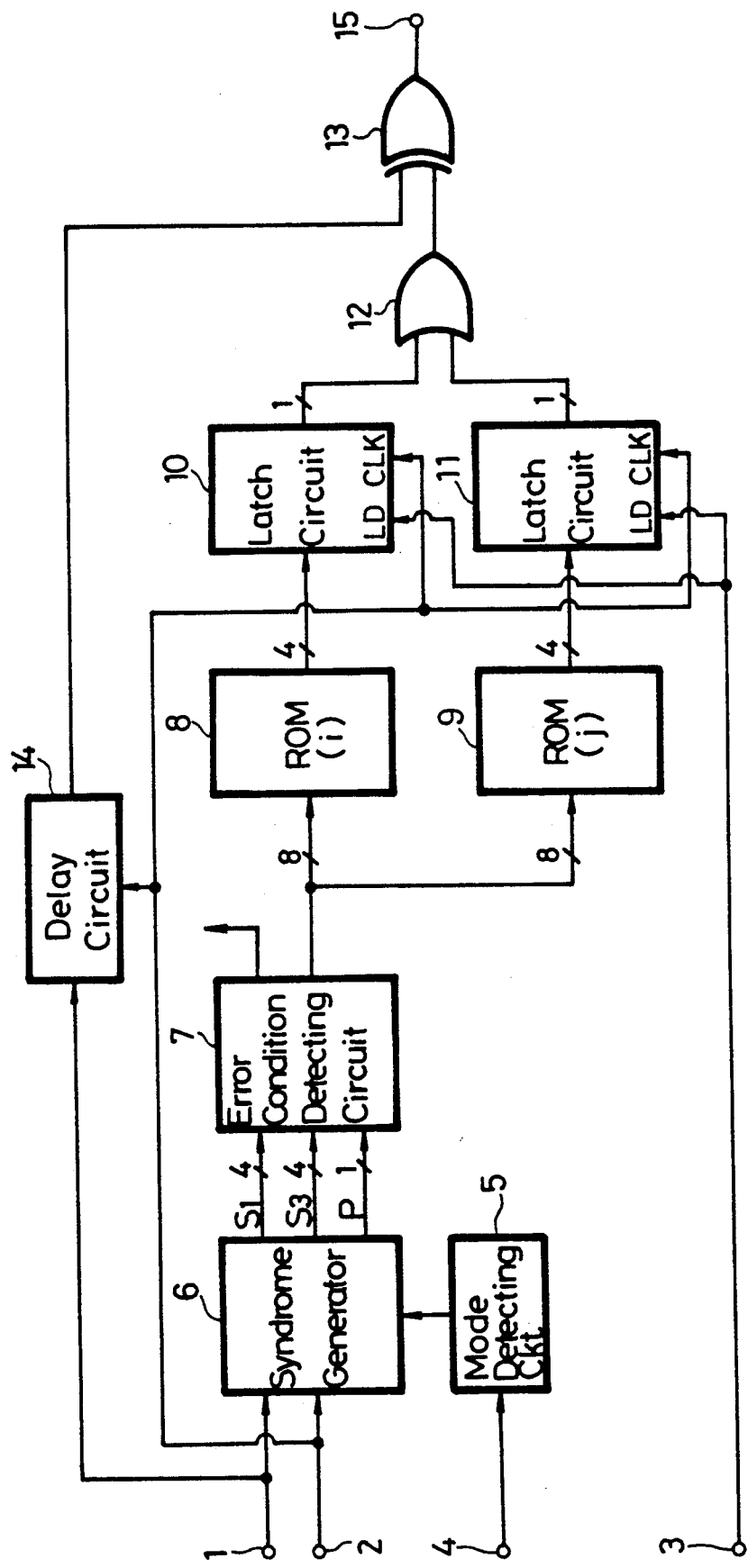
FIG. 1 is a block diagram showing an embodiment of an error correcting apparatus according to the present invention.
Figure 2:
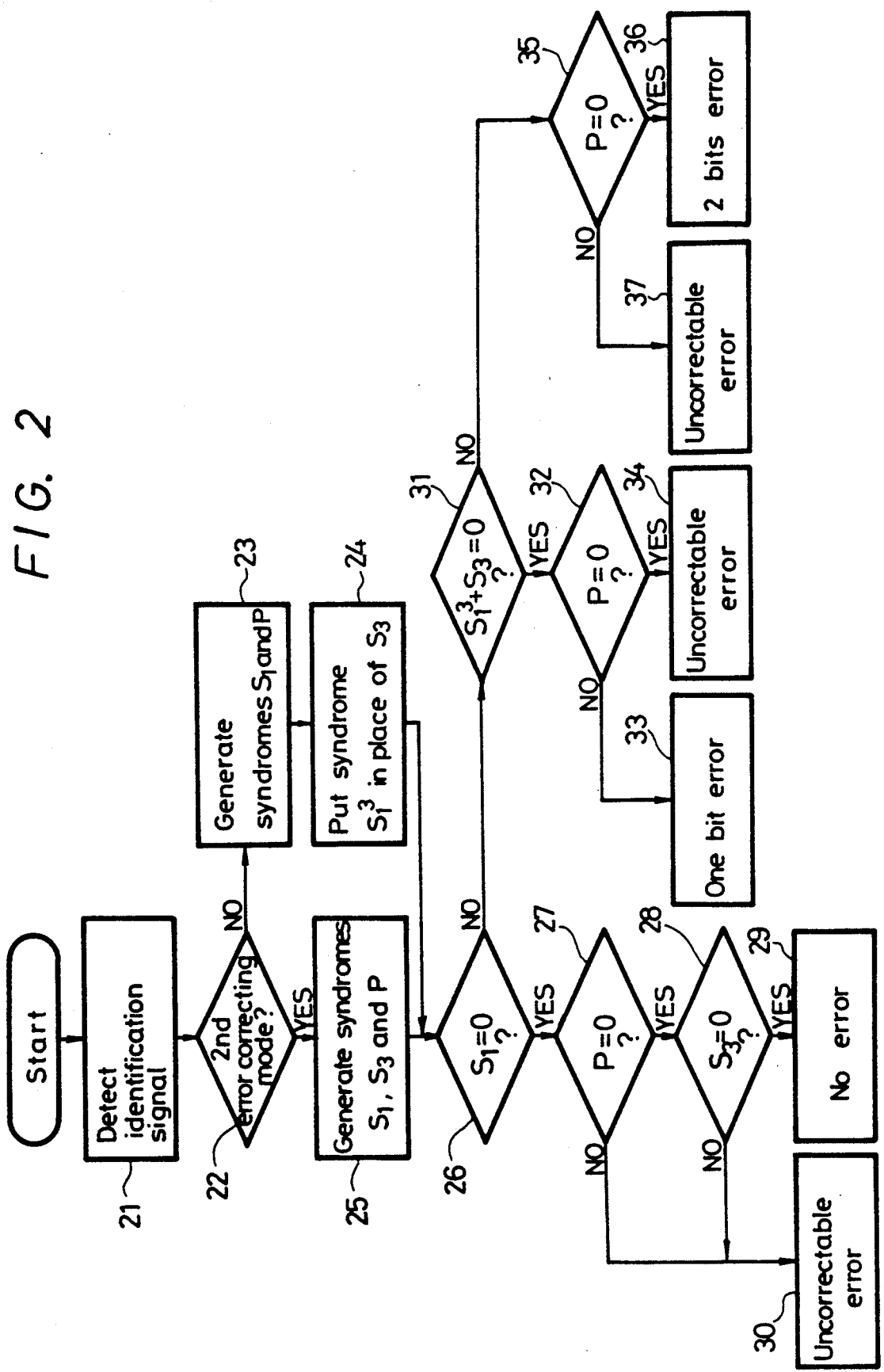
FIG. 2 is a flow chart to which reference will be made in explaining the operation of the error correcting apparatus shown in FIG. 1.

FIG. 1 is a block diagram showing a circuit arrangement of an embodiment of an error correcting apparatus according to the present invention.

Referring to FIG. 1, it will be seen that digital data reproduced from, for example, a record medium or the like (not shown) is applied to a data input terminal 1. A clock signal is supplied to a clock terminal 2 and a load, synchronizing signal is applied to a load input terminal 3. A control input terminal 4 is supplied with a control signal or the like added to the data which is applied to the data input terminal 1. It is to be noted that the control signal applied to the control input terminal 4 contains an identification signal which is used to identify a first error correcting mode and a second error correcting mode. According to the first error correcting mode, the normal error correcting operation is carried out, whereas, according to the second error correcting mode, an error correcting operation more powerful than that of the first error correcting mode is carried out.

There is shown a mode identifying circuit 5 which detects the identification signal from the control signal applied to the control input terminal 4. If the identification signal is, for example, "1", the mode identifying circuit 5 identifies the first error correcting mode, while if the identification signal is "0", the mode identifying circuit 5 identifies the second error correcting mode.

A syndrome generator 6 receives the digital data from the data input terminal 1 in response to the clock signal from the clock terminal 2. The syndrome generator 6 is responsive to the output of the mode identifying circuit 5 to generate syndromes $S_1$ and P for the first error correcting mode and syndromes $S_1$, $S_3$ and P for the second error correcting mode. In this case, in the first error correcting mode, the syndrome $S_3$ is not generated from the syndrome generator 6 so that the syndrome $S_3$ is caused to be converted to a syndrome $S_1^3$ at the syndrome generator 6. In other words, when a single error correction (SEC) is carried out in the first error correcting mode, the single error correction is also effected in the second error correcting mode. If an error occurs at the bit position i where $\alpha$ is a root of a Galois field GF ($2^4$) then $S_1 = \alpha^i$ and $S_3 = \alpha^{3i}$. Thus, $S_3 = (\alpha^i)^3 = S_1^3$.

An error condition identifying circuit 7 executes the steps after step 26 of the flow chart forming FIG. 2, which will be described later, thereby identifying the error condition. The identified results are supplied to a display apparatus (not shown), whereby they are respectively displayed in accordance with the conditions such as no error, single error, double error and triple error or more. While single errors and double errors can be corrected by the error correcting apparatus of the present invention, errors in excess of triple errors cannot be corrected by the error correcting apparatus of the present invention but can be compensated for by a succeeding interpolating circuit (not shown). In case of more than a triple error, a corresponding flag is supplied to the interpolating circuit. In this embodiment, the syndromes $S_1$, $S_3$ and P supplied from the syndrome generator 6 to the error condition identifying circuit 7 are formed of 4 bits, 4 bits and 1 bit, respectively.

There are provided read-only memories (ROMs) 8 and 9. Only the output from the ROM 8 is substantially used for the single error correction (SEC) in the first and second error correcting modes, and the outputs from the ROMs 8 and 9 are both used for the double error correction (DEC) in the second error correcting mode. An eight bit signal (4 bits for $S_1$ and 4 bits for $S_3$) from the error condition detecting circuit 7 is supplied to the ROMs 8 and 9 as the address data. In case of the existence of error, 4 bit error position signals are generated from the ROMs 8 and 9 and are then fed to latch circuits 10 and 11, respectively. Each of the latch circuits 10 and 11 is formed of a 4-bit counter. These latch circuits 10 and 11 are supplied with the clock signal from the clock terminal 2 and are also supplied with the load signal from the load input terminal 3. The latch circuits 10 and 11 are supplied with the error position information. Each time the latch circuits 10 and 11 count the same number of the clocks corresponding to the latched values, they generate the signal "1".

The output signals from the latch circuits 10 and 11 are supplied through an OR circuit 12 to one input terminal of an exclusive-OR circuit 13. A delay circuit 14 is formed of, for example, a shift register and is supplied with the clock signal from the clock terminal 2 for shifting clock. The delay circuit 14 delays the data applied from the input terminal 1 by a word length and supplies the thus delayed data to the other input terminal of the exclusive-OR circuit 13, whereby the data having an error is corrected by the output signal from the OR circuit 12. Consequently, in the exclusive-OR circuit 13, single error correction is effected in the first error correcting mode and double error or more errors are corrected in the second error correcting mode and are then fed to an output terminal 15.

The operation of the error correcting apparatus of the invention shown in FIG. 1 will be described with reference to the flow chart forming FIG. 2.

Following the Start of the operation, at step 21, the identification signal is detected from the control signal applied to the control input terminal 4 by the mode identifying circuit 5. The routine goes to the next decision step 22, in which it is determined on the basis of the identification signal whether the error correcting mode is the first error correcting mode or the second error correcting mode. If it is determined that the mode is the first error correcting mode as represented by a NO at step 22, the routine goes to the next step 23. In step 23, the syndrome generator 6 receives the digital data from the data input terminal 1 and calculates the syndromes $S_1$ and P. In the next step 24, the syndrome $S_1^3$ is put in the place of the syndrome $S_3$.

If it is determined that the mode is the second error correcting mode as represented by a YES at step 22, the routine goes to step 25, in which the syndrome generator 6 receives the digital data from the data input terminal 1 and generates the syndromes $S_1$, $S_3$ and P of the second error correcting mode. The thus calculated syndromes $S_1$, $S_3$ and P are supplied to the error condition detecting circuit 7.

In step 26, it is determined by the error condition detecting circuit 7 whether $S_1=0$. If so, it is determined at step 27 whether $P=0$. If $P=0$, it is determined at step 28 whether $S_3=0$. If $S_3=0$, or if the syndromes $S_1$, P and $S_3$ are all "0", the routine proceeds to step 29. In step 29, it is determined that the corresponding data contains no error, and the data from the delay circuit 14 is directly supplied through the exclusive-OR circuit 13 to the output terminal 15.

If it is neither determined at step 27 that $P=0$ nor at step 28 that $S_3=0$, it is determined in step 30 that the error can not be corrected. The corresponding data from the delay circuit 14 is not corrected and is supplied through the exclusive-OR circuit 13 to the interpolating circuit connected to a later stage of the output terminal 15. Thus, the data is interpolated by the interpolating circuit.

At step 26, if it is determined that $S_1=0$ then it is next determined at step 31 whether $S_1^3+S_3=0$, i.e., whether the error correction is a single error correction. If $S_1^3+S_3=0$, the routine proceeds to step 32. In step 32, it is determined whether $P=0$, i.e., whether the error is an even-numbered bit error or not. If not, i.e., it is determined that the error is the odd-numbered bit error ($P=1$), the routine proceeds to step 33, in which the error is determined as a single error.

When the 8 bit data from the error condition detecting circuit 7 are supplied to the ROMs 8 and 9 as the address data, the ROM 8 generates at its output side an error position information signal which indicates the position of the bit error. This error position information is latched to the latch circuit 10. The address information to the ROM 9 is substantially determined as invalid and the ROM 9 generates no data at its output side. The latch circuit 10 generates the output signal "1" in response to the error position information and supplies its output signal through the OR circuit 12 to the exclusive-OR circuit 13, whereby the error bit of the corresponding data from the delay circuit 14 is inverted and is fed to the output terminal 15 as correct data with one bit corrected.

If it is determined at step 32 that $P=0$, the routine proceeds to step 34. In step 34, it is determined that the error can not be corrected. Therefore, the corresponding data from the delay circuit 14 is not corrected and is directly supplied through the exclusive-OR circuit 13 to the interpolating circuit connected to the later stage of the output terminal 15. Thus, the corresponding data is interpolated by the interpolating circuit.

If it is not determined at step 31 that $S_1^3+S_3=0$, or if it is not determined that the error is a single error, the routine proceeds to step 35. In step 35, it is determined whether $P=0$, that is, whether the error is an even-numbered bit error. If so, i.e. it is determined that the error is an even-numbered bit error ($P=0$) as represented by a YES at step 35, the routine proceeds to step 36, where it is determined that the error is a double error.

When the 8 bit data from the error condition detecting circuit 7 are supplied to the ROMs 8 and 9 as the address information, the ROMs 8 and 9 generate at their output sides error position information signals which indicate the position of the bit error. The error position information signals are respectively latched to the latch circuits 10 and 11. The latch circuits 10 and 11 are responsive to the error position information signals to generate the timing output signals of "1" which are supplied through the OR circuit 12 to the exclusive-OR circuit 13. In the exclusive-OR circuit 13, the error bit of the corresponding data from the delay circuit 14 is inverted and is fed to the output terminal 15 as the correct data in which double error is corrected.

If it is determined that $P=0$ is not satisfied, as represented by a NO at step 35, the routine proceeds to step 37. In step 37, it is determined that the error can not be corrected. Consequently, the corresponding data from the delay circuit 14 is not corrected and is fed through the exclusive-OR circuit 13 to the interpolating circuit connected at the later stage of the output terminal 15. Thus, the error is interpolated by the interpolating circuit.

As described above, the first and second error correcting modes are made common so that the error correcting apparatus of the present invention can be simplified in circuit arrangement.

While BCH codes are described in the above-mentioned embodiment, the code is not limited to BCH codes and other codes such as Reed Solomon code or the like can be utilized similarly.

While the generator polynomial is not limited to the above-mentioned generator polynomial, a partial polynomial of the generator polynomial in the first error correcting mode can be contained in the generator polynomial in the second error correcting mode.

According to the present invention, as set forth above, since a part of the syndrome of the second error correcting mode, which is not generated in the first error correcting mode, is generated from a part or all of the syndrome of the first error correcting mode, the circuit arrangements for the first and second error correcting modes can be made common. Thus, the error correcting apparatus of the present invention can be simplified in circuit arrangement and can be manufactured at low cost.

It should be understood that the above description is presented by way of example on a single preferred embodiment of the invention and it will be apparent that many modifications and variations thereof could be effected by one with ordinary skill in the art without departing from the spirit or scope of the novel concepts of the invention so that the scope of the invention should be determined only by the appended claims.

We claim:

1. An error correcting apparatus comprising:
   (a) means for detecting error correcting modes of incoming digital information;
   (b) means for generating a first set of syndromes for a first error correcting mode when said incoming digital information is detected as employing said first error correcting mode;
   (c) means for generating a second set of syndromes for a second error correcting mode when said incoming digital information is detected as employing said second error correcting mode;
   (d) wherein the means for generating the first set of syndromes includes means for quasi-syndromes for said second error correcting adding an additional syndrome to said first set of syndromes when said incoming digital information is detected as employing said first error correcting mode; and (e) error correction means for applying an error correcting process to said incoming digital information based on said generated syndromes for said second error correcting mode in spite of the error correcting modes of said incoming digital information.

2. An error correcting apparatus as recited in claim 1, wherein a generation polynomial for said first error correcting mode is included in a generation polynomial for said second error correcting mode.

3. An error correcting apparatus comprising:
(1) syndrome generating means supplied with incoming digital information and an identification signal representing an error correcting mode of said incoming digital information for generating a set of syndromes for said incoming digital information based on said identification signal;
(2) error condition detecting means connected to said syndrome generating means for generating an error condition indicating signal based on said set of syndromes;
(3) error correction table means connected to said error condition detecting means for generating an error position signal based on said error condition indicating signal; and
(4) an error correction circuit supplied with said incoming digital information and connected to said error correction table means for correcting bit errors included in said incoming digital information based on said error position signal obtained from said error correction table means.

4. An error correcting apparatus as recited in claim 3, wherein said error correction circuit includes latch circuit means for converting said error position signal into a timing output signal, and an exclusive-OR circuit supplied with said incoming digital information and said timing output signal for correcting bit errors included in said incoming digital information.

5. An error correcting apparatus as recited in claim 4, wherein said error correction circuit receives an error position signal from said error correction table means when said error condition indicating signal indicates that the number of bit errors included in said incoming digital information is less than three.

* * * * *